(12) United States Patent
Sanchez (10) Patent No.: US 7,846,749 B2
(45) Date of Patent: Dec. 7, 2010

(54) METHOD AND DEVICE FOR MONITORING A HEAT TREATMENT OF A MICROTECHNOLOGICAL SUBSTRATE

(75) Inventor: Loïc Sanchez, La Murette (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/305,822

(22) PCT Filed: Jun. 11, 2007

(86) PCT No.: PCT/FR2007/000961

§ 371 (c)(1),
(2), (4) Date: Dec. 19, 2008

(87) PCT Pub. No.: WO2007/147956

PCT Pub. Date: Dec. 27, 2007

(65) Prior Publication Data

US 2010/0015733 A1     Jan. 21, 2010

(30) Foreign Application Priority Data

Jun. 22, 2006  (FR)  .................................. 06 05620

(51) Int. Cl.
*H01L 21/66* (2006.01)
(52) U.S. Cl. ........................................................ 438/14
(58) Field of Classification Search .................. None
See application file for complete search history.

(56) References Cited

U.S. PATENT DOCUMENTS

| | | | | |
|---|---|---|---|---|
| 4,916,439 A * | 4/1990 | Estes et al. | ................... | 340/679 |
| 5,336,998 A * | 8/1994 | Watts et al. | .................. | 324/235 |
| 5,374,564 A | 12/1994 | Bruel | | |
| 5,909,627 A | 6/1999 | Egloff | | |
| 6,387,829 B1 | 5/2002 | Usenko et al. | | |
| 6,732,591 B2 * | 5/2004 | Miles et al. | .................... | 73/808 |
| 6,993,854 B2 * | 2/2006 | Ise et al. | ......................... | 34/58 |
| 7,015,051 B2 * | 3/2006 | Shiba | ........................... | 438/14 |
| 2002/0127852 A1* | 9/2002 | Kawakami et al. | .......... | 438/680 |

FOREIGN PATENT DOCUMENTS

| | | | |
|---|---|---|---|
| EP | 0 938 129 A1 | | 8/1999 |
| EP | 1 014 452 A1 | | 6/2000 |
| JP | 2004-179566 | * | 6/2004 |

OTHER PUBLICATIONS

Machine Translation of JP 2004-179566.*
International Search Report, Mar. 6, 2008.
French Written Opinion, Mar. 6, 2008.

* cited by examiner

*Primary Examiner*—Scott B Geyer
(74) *Attorney, Agent, or Firm*—Brinks Hofer Gilson & Lione (57) ABSTRACT

A method of monitoring a heat treatment of a microtechnological substrate includes placement of the substrate to be treated in a heating zone and applying a heat treatment to the substrate, under predetermined temperature conditions, while monitoring the change over the course of time in the vibratory state of the substrate, and detecting a fracture in the substrate by detecting a peak characteristic in the vibratory state over the course of time.

14 Claims, 5 Drawing Sheets

METHOD AND DEVICE FOR MONITORING A HEAT TREATMENT OF A MICROTECHNOLOGICAL SUBSTRATE

PRIORITY CLAIM

The application is nationalization under 35 U.S.C. 371 of PCT Application No. PCT/FR2007/000961 filed Jun. 11, 2007, which claims priority to French Patent Application. No. 0605620, filed Jun. 22, 2006.

TECHNICAL FIELD

The invention concerns monitoring the heat treatment of a microtechnological substrate (which is also referred to as a microtechnological structure and can be formed of a number of layers, some of which may themselves be substrates).

It aims in particular, but not exclusively, to produce microtechnological layers, for example by weakening and separation within a microtechnological substrate (especially in a semiconductor material), or even by separation at a bonding interface within a microtechnological substrate.

These microtechnological layers are generally produced by submicron-scale fabrication techniques, including microelectronic technologies and microsystem fabrication technologies (micromachining, and the like). These layers can be thin (typically of the order of one micron thick or even thinner) or thicker (having a thickness which can be as much as that of a substrate as such, and in particular, typically of the order of a few hundred microns, for example 700 microns for a 200 mm diameter wafer).

The invention aims in particular to monitor the heat treatment that production of such microtechnological layers includes in practice with a view to bringing about such separation, whether separation is to occur at the end of the heat treatment or subsequently.

It applies in particular, but not exclusively, to using the "Smart Cut©" process, as described in the U.S. Pat. No. 5,374,564 in particular.

BACKGROUND

Figure 1:
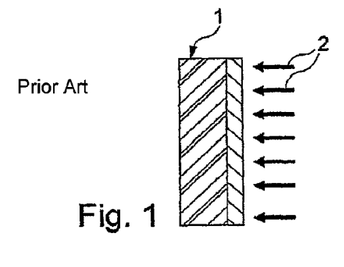
FIG. 1 is a diagram representing a first step of a known version of the "Smart Cut©" process.
Figure 2:
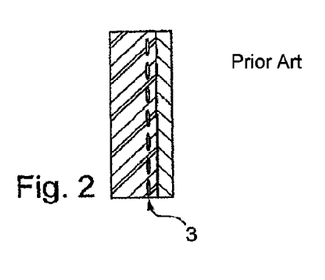
FIG. 2 is a diagram of the result of this first step.
Figure 3:
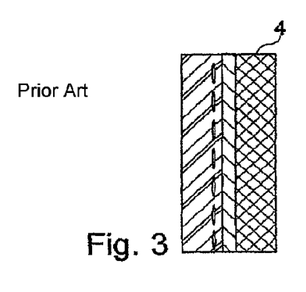
FIG. 3 is a diagram of a second step of this process.
Figure 4:
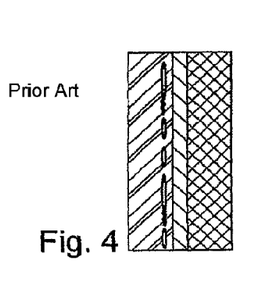
FIG. 4 is a diagram of a third step of this process.
Figure 5:
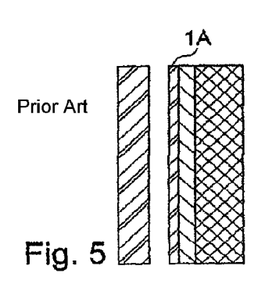
FIG. 5 is a diagram showing the result of this third step.

As indicated in the above document in particular, the "Smart Cut®" process consists in implanting a starting substrate (such as a silicon plate or wafer, in practice having an oxidized surface) with hydrogen ions (see FIG. 1) to create a weakened zone 3 (see FIG. 2). This first plate is then transferred onto a second substrate 4 (for example a second silicon plate or wafer) using an appropriate bonding technique (see FIG. 3), for example molecular bonding. The resulting bonded assembly is then placed in a furnace to undergo annealing during which defects coalesce (see FIG. 4) and at the end of which a layer, for example a thin layer, is transferred (see FIG. 5), i.e. the layer 1A of the starting substrate situated between the surface and the weakened zone is detached from the remainder of the starting substrate, remaining bonded to the second substrate.

This heat-activated process leads to maturing of the defects generated by the weakening and propagation of microcracks (caused by those defects), up to the point of complete transfer of the microtechnological layer, by separation or fracture along the weakened zone.

The thickness of the layer obtained in this way, when it is a thin layer (the expression thin film is sometimes also used), is typically a few hundred nanometers, while the thickness of the substrate is approximately 700 μm (see above); it is clear that the starting substrate can then be subjected to repetition of the process to form a number of thin layers in succession.

In a first embodiment of the method, the transfer takes place during the heat treatment (possibly combined with the application of complementary forces, such as mechanical stresses), while in a second embodiment the heat treatment is followed by a complementary treatment (for example involving the application of forces, such as mechanical stresses) during which the transfer takes place.

Depending on whether the heat treatment is intended to bring about the transfer separation or must be interrupted before such separation, the benefit that there would be in knowing how to measure the duration of the annealing that leads to such separation or how to define the moment at which separation occurs is clear. If separation is to occur during the heat treatment, it is of no benefit to extend the heat treatment beyond separation, for obvious reasons of saving energy; on the other hand, if separation is to occur only after the heat treatment, it can be of benefit, as a safety measure, to be able to detect that unintentional separation has occurred and to interrupt the heat treatment before other items from the same batch also suffer unintentional separation; microtechnological layers are often produced in batches, and it is of benefit to be able to interrupt the heat treatment at the latest at the moment when one of the items being treated is subject to separation, to protect the other items and the equipment in which the heat treatment is effected, to prevent excessive contamination caused by the items breaking.

Consequently, the benefit of being able to detect such fracture or separation automatically or at least in a manner that lends itself to automation is clear. Knowing how to measure the duration of the heat treatment before the transfer separation or how to detect such separation is of particular benefit if the separation technology is applied to substrates consisting of new materials, i.e. if there is as yet insufficient data to be able to predict an optimum duration for the heat treatment.

Until now, this detection has been done by ear, because fracture produces a sound that is in theory audible, which requires close attention if it is to be discerned with certainty, given the generally noisy environment, especially if there is a batch of items the respective fractures in which are to be detected. There are many sources of unwanted noise: ventilation, which can be intense (in the room containing the furnace), opening or closing a door, movement of persons in the room, etc. The transfer heat treatment can be carried out at a temperature of several hundred ° C. and can have a duration from a few minutes to several hours.

At present, detecting this sound is tiresome and often somewhat uncertain.

SUMMARY

An object of the invention is to render this detection of separation (or fracture) less tiresome and more reliable and to enable systematic measurement of the heat treatment duration.

It is therefore clear that the invention therefore aims, in an industrial context, to limit the heat treatment time to that which is necessary to obtain separation (and consequently to improve the availability of the equipment, reduce fabrication costs, etc.). It can also guarantee that all items in the same batch being treated have fractured before the heat treatment is interrupted (improved yield, etc.). Conversely, if the heat treatment is not intended to cause separation, the invention aims to enable detection of unintentional separation and protection of other items from the same batch and/or the equipment in which the heat treatment is effected.

To this end, the invention proposes a method for monitoring heat treatment of a microtechnological substrate, including the following steps:

placing the substrate to be treated in a heating zone, applying heat treatment to said substrate to be treated under predetermined temperature conditions and monitoring the evolution over time of the vibratory mechanical state (in particular, movement) of the substrate to be treated, detecting fracture of the substrate to be treated by recognizing a peak characteristic of a fracture in the evolution over time of the vibratory state.

This monitoring method can be used, or not, in the production of microtechnological layers.

According to preferred features of the invention, where applicable combined:

the evolution over time of the vibratory state of the substrate to be treated is monitored by monitoring the vibratory state of a support on which the substrate to be treated is situated, which avoids having to come into direct contact with the substrate, the support includes a portion outside the heating zone and its vibratory state is monitored via said outside portion, which facilitates the placement of the vibration measuring means, the heat treatment being intended for the production of microtechnological layers, the substrate to be treated is prepared prior to the heat treatment by weakening it by implanting ions or gaseous species, which is a technique well known for the preparation of thin layers, in particular by the "Smart Cut©" process, preparation includes fastening the weakened substrate to a second substrate, which is conventional in itself if the future thin layer is too thin to be manipulated subsequently without damaging it, the substrate is submitted prior to the heat treatment to a preparation including bonding the substrate to a second substrate, preferably by molecular bonding, which can correspond to a great variety of microtechnological treatments, the substrate is based on silicon, which is a material commonly used for the fabrication of thin layers, although the invention also applies to substrates produced in a material on the behavior of which during heat treatment there is little or no data, the vibratory state is monitored by a vibration sensor, preferably a piezo-electric sensor, the heat treatment having the function of bringing about at least one fracture of the substrate for the formation of a microtechnological layer, the heat treatment is interrupted when a number of peaks have been detected corresponding to the number of substrate fractures expected as a consequence of the heat treatment; advantageously, a number of substrates are prepared and placed in the heating zone on the same support, the same heat treatment is applied to said substrates and the vibratory state of said support is monitored, the number of substrate fractures expected being equal to the number of substrates, alternatively (if the heat treatment is not intended to generate fracture during the treatment alone or on the other hand aims to protect the integrity of the substrates), a number of substrates are prepared and placed in the heating zone on the same support, the same heat treatment is applied to said substrates and the vibratory state of said support is monitored, and the heat treatment is interrupted as soon as a fracture is detected, a peak characteristic of a fracture is recognized by the presence of alternations that are close together and of decreasing amplitude.

The invention further proposes a device adapted to implement the above method when the vibratory state of the substrate is monitored via that of its support.

It therefore proposes a device for monitoring heat treatment of a microtechnological substrate, including:

a furnace including a support adapted to receive substrates to be treated, and a control device of the furnace, characterized in that it further includes a mechanical vibration sensor adapted to sense vibration of the support and connected to a system for processing the signal from the sensor.

Like the heat treatment method, the heat treatment device can optionally be adapted to bring about the separation of a microtechnological layer.

According to preferred features, where applicable combined:

the processing system is connected to the furnace control device, the sensor is a piezo-electric sensor.

BRIEF DESCRIPTION OF THE DRAWING

Objects, features and advantages of the invention emerge from the following description, which is given by way of illustrative and nonlimiting example and with reference to the appended drawings, in which.

DETAILED DESCRIPTION

Figure 6:
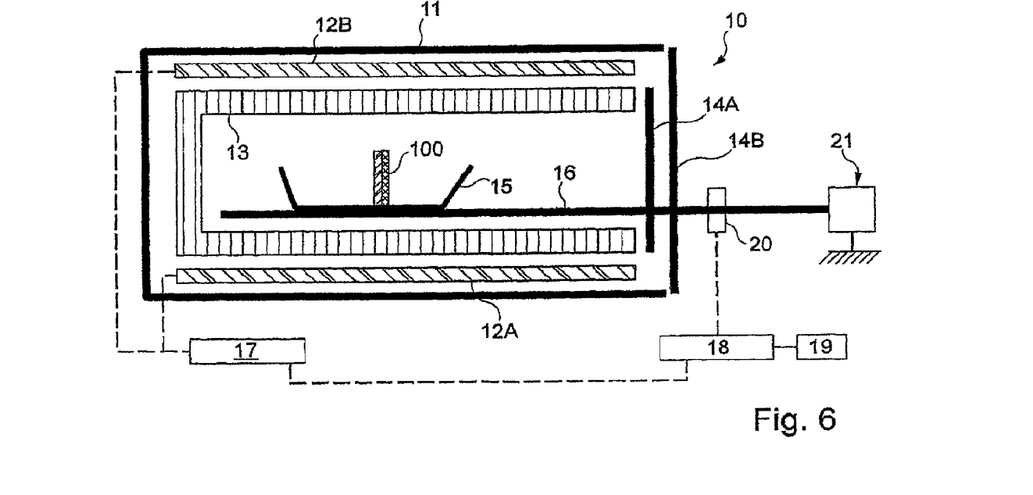
FIG. 6 is a theoretical diagram of a furnace implementing the method of the invention.

FIG. 6 represents an example of an annealing furnace 10 adapted to implement the invention. It is a horizontal furnace in which the assembly to be treated is inserted by a horizontal movement in translation.

The production of thin layers is considered hereinafter by way of example.

The furnace includes a frame 11 provided with heating elements 12A and 12B, here situated in the lower portion and in the upper portion of the interior volume of the frame; these elements can form part of the same cylindrical assembly if the frame is of cylindrical shape. Between the heating elements 12A and 12B there is a heating chamber 13, here in the form of a quartz tube. Here, this heating chamber is closed by one or more heat shields (here two heat shields 14A and 14B). In the heating chamber there is placed a microtechnological substrate (or wafer) 100 to be treated, conforming to the FIG. 3 assembly, i.e. including a substrate weakened beforehand so as to delimit a thin layer and a second substrate onto which that thin layer is to be transferred. This assembly 100 to be treated is disposed on a support, here in the form of a crucible 15, itself carried by a shovel 16 by means of which the assembly 100 is placed in the furnace. The heat shields 14A and 14B are generally attached to the shovel 16 and close the heating chamber when the shovel is advanced sufficiently into the furnace. Here, a retaining device 21 holds the shovel 16 mechanically in position when the furnace is closed. This retaining device can also move the shovel between its innermost and outermost positions, for example by means of a guide rail (not shown).

This shovel 16 includes, on either side of the heat shields, a portion (on the left) situated inside the furnace and a portion (on the right, in practice a rod) situated outside the furnace. The heating elements are conventionally connected to a power supply and control unit 17.

To implement the invention, the furnace is further provided with a vibration sensor 20 at least indirectly in contact with the wafer 100. In FIG. 6, this sensor is mounted on the external portion of the shovel 16; it is therefore in contact with the wafer 100 via the left-hand portion of the shovel and the crucible. Because it detects motion vibrations (or vibratory motions), it may be referred to as a mechanical vibration sensor.

In a variant that is not shown, this vibration sensor is mounted on another portion of the wafer support, for example on the crucible. It can therefore, alternatively, be mounted on one or both of the shields or on the retaining device 21, or more generally on any part liable to vibrate because of the vibration of the wafer 100.

Mounting the sensor on an external portion of the wafer support (or linked thereto) has the advantage of not subjecting the sensor to the heat to which the wafer is subjected and of preventing contamination of the heating chamber by said sensor. On the other hand, mounting the sensor as close as possible to the wafer, for example inside the furnace, has the advantage of acquiring a signal of greater amplitude and therefore of detecting any fracture more easily. This obliges this sensor to withstand the same thermal environment as the wafer to be treated, however, but it will be evident to the person skilled in the art how to choose vibration sensors resisting the temperatures necessary for the treatment of the wafers to be treated (which depend on the material of which the substrates used consist). Such sensors are in principle more costly than sensors that can be placed outside the furnace, however.

The vibration sensor is a piezo-electric sensor, for example. Alternatively, it can consist of other types of vibration sensors (including capacitive probes, eddy current probes, mobile coils, piezoresistive sensors, etc.).

The sensor delivers a signal processed by a processor system 18 including appropriate software to monitor the evolution over time of the vibratory state of the sensor, as described hereinafter. The choice of software will be evident to the person skilled in the art, given their general background knowledge and information given hereinafter. The software can store this evolution over time, detect a peak characteristic of a fracture, and, where appropriate, trigger consequential action on the power supply of the furnace (for example to trigger a cooling phase). The system 18 advantageously includes a display device 19 and is advantageously connected to the power supply so as to be able to influence the operation of the furnace upon detection of a fracture, if necessary and if the operator requires this.

Figure 7:
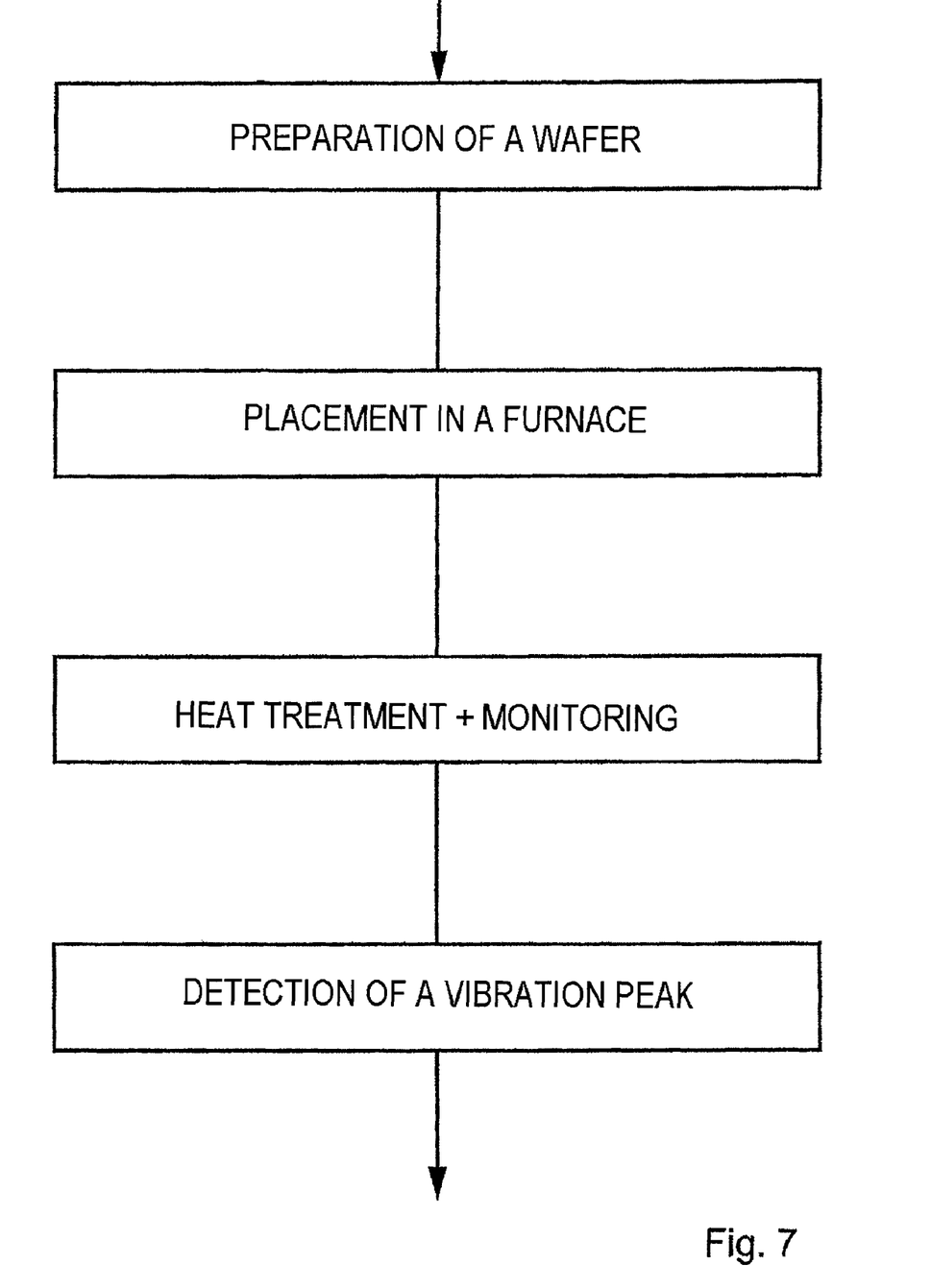
FIG. 7 is a diagram of the main steps of the method of the invention.

FIG. 7 represents the main steps of the method of the invention for monitoring heat treatment of the substrate 100 in the situation considered here of production of thin layers:

step 1 (optional): a wafer that has advantageously been weakened (like that from FIG. 1) is prepared in a manner known in the art, step 2: the wafer is placed in a furnace, for example on a support, step 3: the wafer undergoes heat treatment under predetermined temperature conditions, and the evolution over time of the vibratory state of the wafer is monitored (here via that of the support), step 4: fracture of the weakened wafer is detected by recognition in the evolution over time of the vibratory state of a peak with predetermined characteristics. Action on the power supply of the heating zone can then be triggered, if required.

Note that, if the aim is to produce thick microtechnological layers (for example of the order of one micron thick), it may not be necessary to bond the first substrate to a second substrate to enable subsequent manipulation of the thin layer after separation.

It will be evident to the person skilled in the art how to define the characteristics of a peak representative of a fracture by means of a few simple tests; this is described in detail later.

Two types of tests have been carried out in two different furnaces. Fracture annealing was effected in a 200 mm horizontal TEMPRESS furnace in a white room (particularly well adapted to the fracture of complete plates, which can be disks of more than 20 centimeters in diameter); this furnace conforms to the FIG. 6 diagram. Other tests were effected in a 100 mm horizontal AET furnace, not in a white room (particularly well adapted to the fracture of plate fragments, and thus for assemblies to be treated smaller than the aforementioned disks). The FIG. 6 diagram applies also to this second furnace. The invention can of course be implemented in other types of furnace or heat treatment frame, in particular vertical furnaces, provided that the vibration of the wafer is transmitted with sufficient amplitude.

Clearly, in both cases, the environment may be noisy, in particular because of events such as cycles of operation of a powerful ventilation system, opening and closing of doors, movement of persons, etc. The annealing temperature can be a few hundred ° C. and the duration can range from hardly a few minutes to several hours, depending on the materials and the temperatures chosen.

Sound recording has been attempted but has proved much less satisfactory than recordings made, as indicated above, using vibration sensors "attached" (from the vibration point of view) to the assembly to be treated, in practice carried by the support of that assembly to be treated, and for which the ranges of frequencies monitored are at least in part outside the audible range.

The tests were carried out using a piezo-electric device (PC buzzer type), the signal from which was amplified approximately 20 times. This signal was recorded via the microphone socket of a PC sound card in the form of a sound (wav, wma or mp3) file. All the following results were obtained using this setup. Tests were effected on the two types of furnace.

The wafers to be treated (either complete disks or fragments) were of silicon and the treatment temperatures were of the order of 500° C.

A first test was conducted in the first furnace (200 mm, white room) under the following conditions:

piezo-electric device placed directly on the rod of the shovel, detection of fracture of two complete plates (200 mm diameter).

Figure 8:
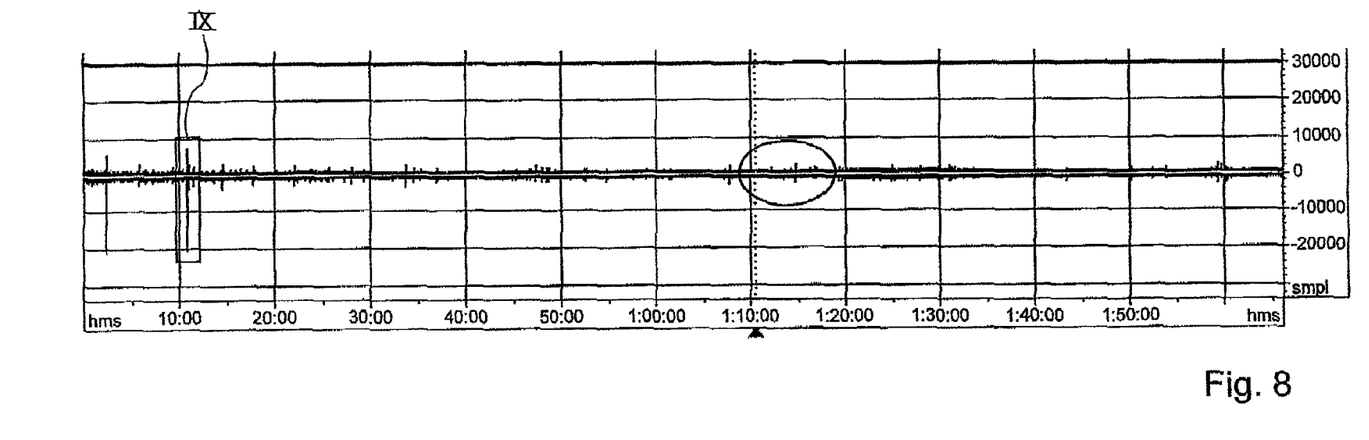
FIG. 8 is a graph showing the vibrations observed in a first embodiment of the invention.

FIG. 8 represents a graph obtained in this way, with time (in milliseconds) on the abscissa axis and an arbitrary unit on the ordinate axis.

A multitude of small peaks are observed (one of which is enclosed in an ellipse): these represent noise resulting from the measurement process and the white room environment.

Two clear peaks are also observed in the left-hand portion of the graph, which descend very obviously below the median line. Note that in the enlargement of the second peak represented in FIG. 9, this peak, which is representative of a fracture, includes a plurality of alternations very close together and of decreasing amplitude, followed by a few harmonic vibrations that are hardly detectable.

A second test was conducted in the presence of external disturbances, under the same measurement conditions as the first test, in order to detect the fracture of a wafer.

Figure 9:
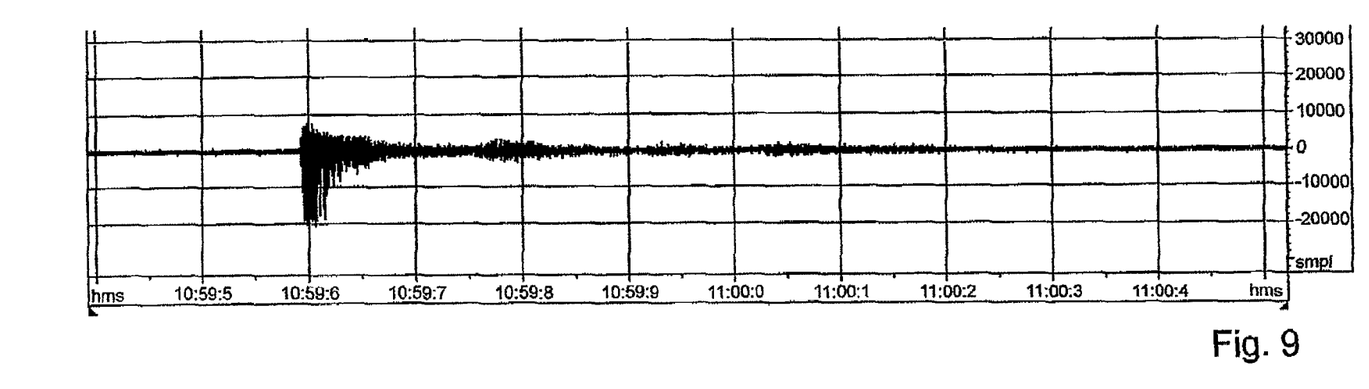
FIG. 9 is a graph representing an enlarged view of the portion of the FIG. 8 graph inside the rectangle marked IX.
Figure 10:
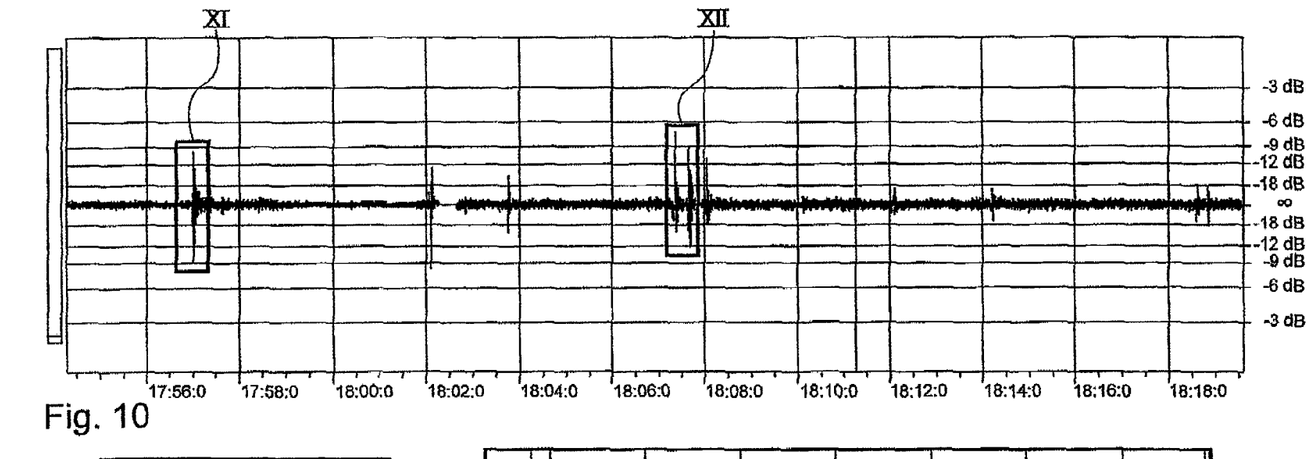
FIG. 10 is a graph similar to that of FIG. 8, but corresponding to a second embodiment of the invention.
Figure 11:
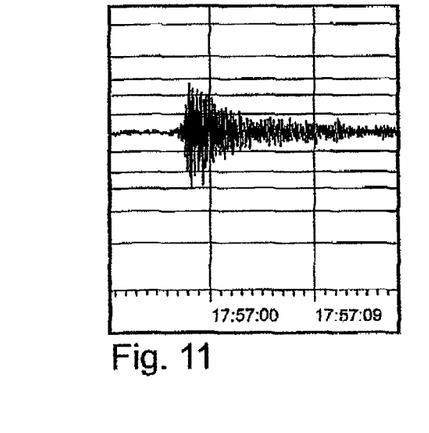
FIG. 11 is an enlargement of the detail from the FIG. 10 graph delimited by the left-hand rectangle marked XI, corresponding to a fracture.
Figure 12:
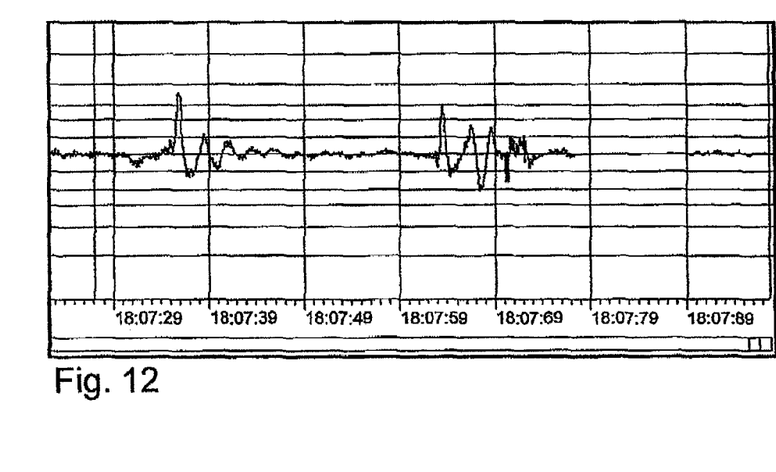
FIG. 12 is an enlargement of the detail from the FIG. 10 graph delimited by the right-hand rectangle marked XII that is the furthest to the right.

Various types of peaks are observed in the FIG. 10 graph, including a peak on the left-hand side which when enlarged (see FIG. 11) shows, like FIG. 9, a plurality of alternations very close together and of decreasing amplitude, followed by a few residual vibrations: this peak is representative of the fracture of the wafer being treated. On the other hand, as is clear from FIG. 12, the other peaks, which are narrower and situated more in the middle of the graph, include only a small number of alternations: these peaks correspond to external disturbances (caused here by an operator who knocked the furnace frame with their elbow).

A third test was effected under the same conditions as before, where the items to be treated consisted of a batch of seven wafers.

Figure 13:
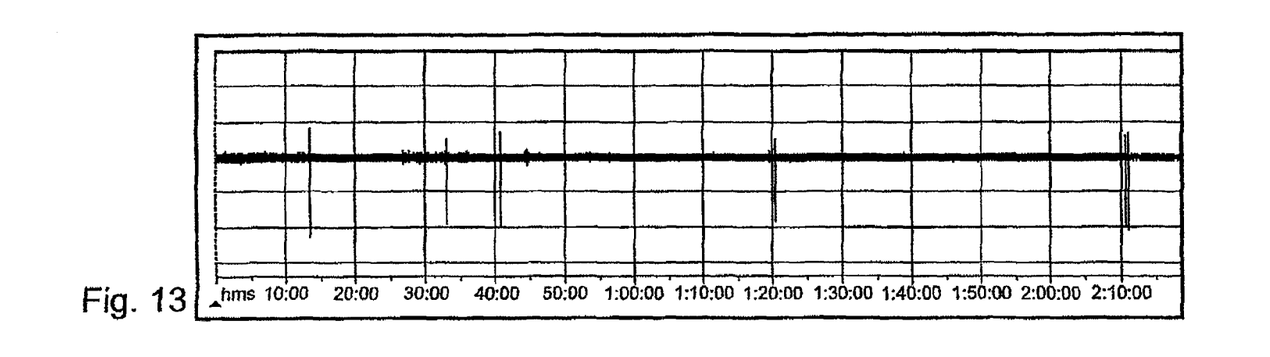
FIG. 13 is a graph similar to that of FIGS. 8 and 10 but corresponding to a third embodiment, with a batch of 7 wafers to be fractured.

Seven peaks are observed in the FIG. 13 graph of a kind very similar to the FIG. 8 peaks. The seven peaks correspond to fracture of the seven wafers to be treated. Note that the first precedes the last by about two hours; it is worth emphasizing that the last two fractures were virtually simultaneous (within the same period of one minute) but generated distinct peaks.

A fourth test was effected in the second furnace, i.e. the furnace outside the white room, under the following conditions:

piezo-electric device placed on a part retaining the rod of the shovel (the rod being too hot for the device, there was doubtless some loss of sensitivity), detection of the fracture of a small wafer fragment of a few $cm^2$.

As it had been decided to consider the shovel rod as too hot, the piezo-electric device was therefore placed on the part 21 mechanically retaining the rod of the shovel. It is possible that moving the sensor away from the wafer fragment in this way (the contact between the sensor and the wafer fragment is established through a greater number of parts than in the previous tests) contributed to reducing the sensitivity of the system, in combination with the fact that the fracture of a wafer fragment naturally produces less vibration than the fracture of a complete wafer.

Figure 14:
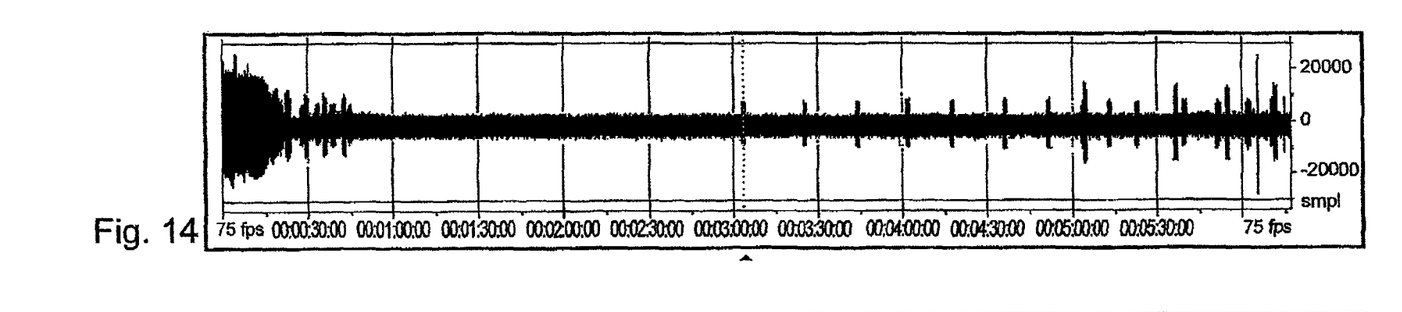
FIG. 14 is a graph corresponding to a further embodiment of the invention.
Figure 15:
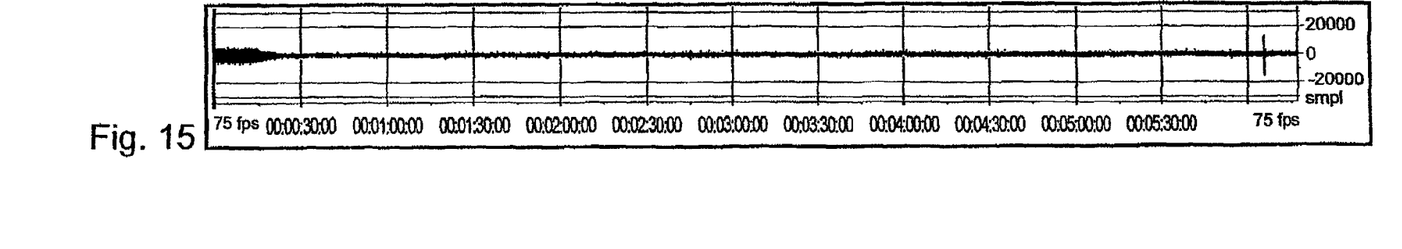
FIG. 15 is a graph corresponding to the FIG. 14 graph after filtering.

Small vibration peaks occurring fairly regularly are observed in FIG. 14, no doubt caused by temperature regulation system starting cycles, as well as, far over to the right, a clearer peak the form of which appears to correspond to that of the peaks in FIG. 13 in particular. Applying the unprocessed signal from FIG. 14 to an 800 Hz-5000 Hz band-pass filter (see FIG. 15) confirmed that this narrow peak far over to the right is of a particular type; it was possible to verify that this was indeed a peak characteristic of the fracture of the wafer fragment undergoing treatment.

This demonstrated the validity of the detection principle for the two furnaces chosen, and identification of peaks characteristic of a fracture proved possible and reliable (the signature of a fracture proved to be clearly identifiable in amplitude and in frequency for silicon, but it would appear entirely realistic to assume that the same would apply for other materials).

The setup described is more than a little ad hoc but lends itself without difficulty to optimization with a view to improved ergonomics and a service life compatible with requirements.

It is therefore clear that the invention proposes a complete solution (known sensor, standard conditioning of the sensor signal, software that is simple to develop) capable of measuring the duration of annealing that has led to the fracture of one or more assemblies to be treated during fracture heat treatment, such as that used in the "Smart Cut©" technology. The method of the invention and the proposed device for implementing it nevertheless apply more generally provided that it is possible, in a process for the production of thin layers, to bring about separation within a substrate by means of heat treatment, whether the heat treatment is intended to cause such separation (alone or in combination with the application of complementary effects) or merely to prepare for such separation, which is to occur subsequently (in this latter case, the invention verifies that there is no unintentional separation and, if necessary, detects that there is a risk of separation of an entire batch of parts before all the parts have undergone separation).

Detection is based on the signal generated by a vibration sensor, advantageously a piezo-electric sensor "fastened" to the assemblies (wafers, wafer fragments or structures) to be fractured (or monitored); because of this fastening there is continuity of contact between the sensor and the part to be fractured, capable of transmitting vibration. The quality of transmission of vibration by contact is of course all the better if there is a small number of parts between the sensor and the part to be fractured and those parts are in close contact. The sensor can be placed on the structure, the crucible, the shovel, etc. To limit the thermal stresses on the sensor (and to prevent contamination of the furnace), the sensor is advantageously outside the furnace.

More generally, the invention encompasses other types of heat treatment used in the production of thin layers in the field of microtechnologies. Thus it applies, in particular, to the detection of dissociation at the bonding interface of a bonded pair of plates (the term "heterostructures" is commonly used if the plates are of different materials), and equally to the detection of unintended fracture of a bonded pair of plates (at the bonding interface or elsewhere), during heat treatment, for example in order to disable the furnace (reduce the temperature), if necessary, as soon as an unintended fracture is detected, to protect the other plates and/or the equipment.

In fact, the invention applies very generally to monitoring heat treatment applied to a microtechnological substrate, whatever the function of that heat treatment.

In practice, it is recommended that the sensor be able to withstand temperatures of at least approximately 80° C. (which is the approximate temperature of the furnace shovel rod under very unfavorable conditions).

The person skilled in the art will have no difficulty in implementing the invention, given the above information and their general background knowledge. For example, where the software is concerned, it could be constituted in three parts (which could correspond to three windows):

a parameters part, a measurement part, and a part for reading and processing a stored curve.

As for the acquisition parameters, they can be chosen by appropriately choosing the parameter settings (gain, and the like) of the acquisition card (if the acquisition card allows this); the choice could be made to activate the band-pass filter or not on real-time acquisition and choose the filter high and low cut-off frequency settings as required. There is a free technical choice in respect of the filter(s), but parameterable filters are recommended, and in particular, if a band-pass filter is selected, the possibility of entering a cut-off frequency equal to zero or infinity.

It will also be evident to the person skilled in the art how to adjust the detection parameters (for example: the amplitude and/or frequency threshold, depending on the detection method chosen).

The measurement part corresponds to acquisition as such, using the aforementioned parameters.

The reading and/or processing part can be effected in real time or after the measurement has been saved (with (or without) filtering, with (or without) automatic detection of the fracture (human detection can be retained) and automatic triggering of a reaction (stopping of the heat treatment), or simply supply information to the user, and the like.

The invention claimed is:

1. A method for monitoring heat treatment of a microtechnological substrate, the method comprising the following steps:

placing the substrate in a heating zone;

applying the heat treatment to the substrate under predetermined temperature conditions and monitoring the vibratory mechanical state of the substrate; and detecting a fracture of the substrate by detecting a peak characteristic of the vibratory mechanical state.

2. The method according to claim 1, wherein monitoring the vibratory mechanical state of the substrate comprises monitoring the vibratory state of a support underlying the substrate.

3. The method according to claim 2, wherein the support includes a portion outside the heating zone and monitoring the vibratory state of the support comprises monitoring the portion outside the heating zone.

4. The method according to claim 1, wherein the heat treatment is configured for the production of microtechnological layers, and wherein the method further comprises preparing the substrate prior to the heat treatment by implanting ions or gaseous species to weaken the substrate.

5. The method according to claim 4, wherein preparing the substrate further comprises fastening the substrate to a second substrate.

6. The method according to claim 1 further comprising preparing the substrate prior to the heat treatment by bonding the substrate to a second substrate.

7. The method according to claim 6, wherein bonding the substrate comprises molecular bonding.

8. The method according to claim 1, wherein the substrate comprises silicon.

9. The method according to claim 1, wherein monitoring the vibratory state comprises monitoring a vibration sensor.

10. The method according to claim 9, wherein the vibration sensor comprises a piezo-electric sensor.

11. The method according to claim 1, wherein, applying the heat treatment comprises bringing about at least one fracture of the substrate for the formation of a microtechnological layer, and wherein the heat treatment is interrupted when a predetermined number of peak characteristics in the vibratory state have been detected corresponding to the number of substrate fractures as a consequence of the heat treatment.

12. The method according to claim 11 further comprising preparing a number of substrates and placing the substrates in the heating zone on the same support, wherein the same heat treatment is applied to the substrates, and the vibratory state of the support is monitored, and wherein the number of substrate fractures is equal to the number of substrates.

13. The method according to claim 1, further comprising preparing a number of substrates and placing the substrates in the heating zone on the same support, wherein the same heat treatment is applied to the substrates and the vibratory state of the support is monitored, wherein the heat treatment is followed by fracturing each of the substrates, and wherein the heat treatment is interrupted as soon as a fracture is detected.

14. The method according to claim 1, wherein a peak characteristic of a fracture is detected by the alternations in the vibratory mechanical state that are close together and of decreasing amplitude.

* * * * *